United States Patent [19]
Yamaguchi et al.

[11] Patent Number: 6,118,152
[45] Date of Patent: Sep. 12, 2000

[54] SEMICONDUCTOR DEVICE AND METHOD OF MANUFACTURING THE SAME

[75] Inventors: Hitoshi Yamaguchi, Obu; Toshiyuki Morishita, Iwakura; Toshimasa Yamamoto, Ama-gun, all of Japan

[73] Assignee: Denso Corporation, Kariya, Japan

[21] Appl. No.: 09/181,613

[22] Filed: Oct. 28, 1998

[30] Foreign Application Priority Data

Nov. 5, 1997 [JP] Japan ..................................... 9-302694
Aug. 21, 1998 [JP] Japan ................................. 10-236135

[51] Int. Cl.$^7$ ................................................. H01L 29/72
[52] U.S. Cl. ......................... 257/347; 257/368; 257/514; 257/544; 438/151; 438/224; 438/479; 438/584
[58] Field of Search ..................................... 257/347, 368, 257/514, 544; 438/151, 224, 479, 584

[56] References Cited

U.S. PATENT DOCUMENTS 5,434,444  7/1995  Nakagawa et al. ..................... 257/296
5,602,551  2/1997  Fukumoto et al. .

FOREIGN PATENT DOCUMENTS 56-131941  10/1981  Japan .
59-186341  10/1984  Japan .
3-95912    4/1991   Japan .
4-186746   7/1992   Japan .
6-151576   5/1994   Japan .
6-87480    11/1994  Japan .
7-147319   6/1995   Japan .

*Primary Examiner*—Edward Wojciechowicz
*Attorney, Agent, or Firm*—Pillsbury Madison & Sutro LLP

[57] ABSTRACT

A silicon layer provided in a silicon substrate through a buried oxide film includes a silicon island partitioned by a trench. A surface of the silicon island in the trench is covered with a side wall oxide film, and LDMOS transistors are formed in the trench. A first impurity-doped polysilicon layer for applying a substrate potential is disposed between the buried oxide film and the substrate, and a second impurity-doped polysilicon layer is buried in the trench to communicate with the first impurity-doped polysilicon layer. Further, electrodes for applying the substrate potential are disposed on the second impurity-doped polysilicon layer. Accordingly, the substrate potential can be readily applied from the surface of the silicon layer.

27 Claims, 17 Drawing Sheets

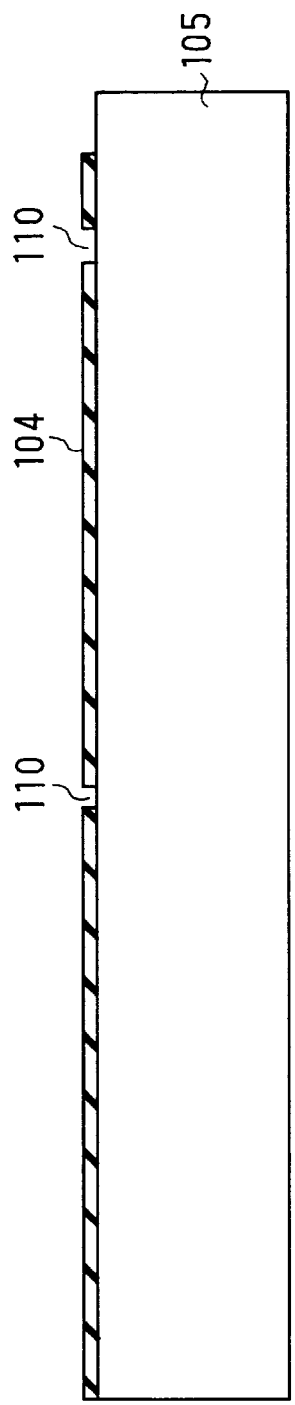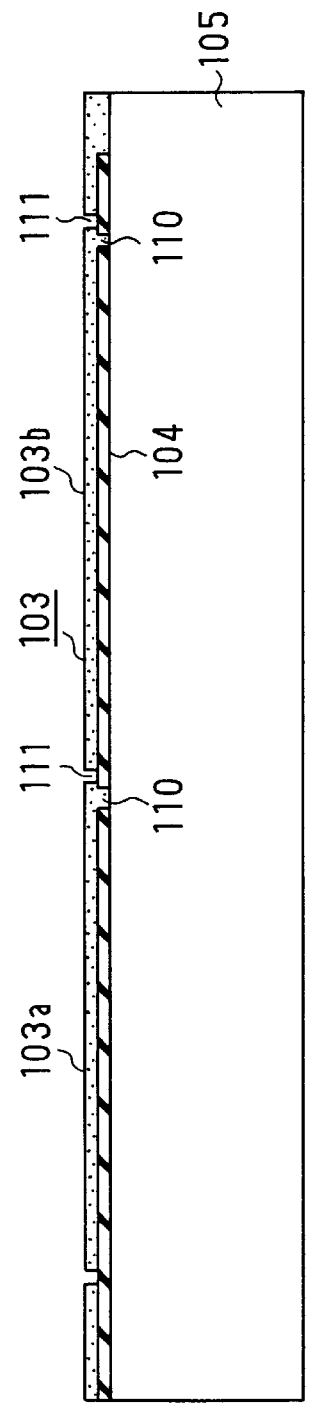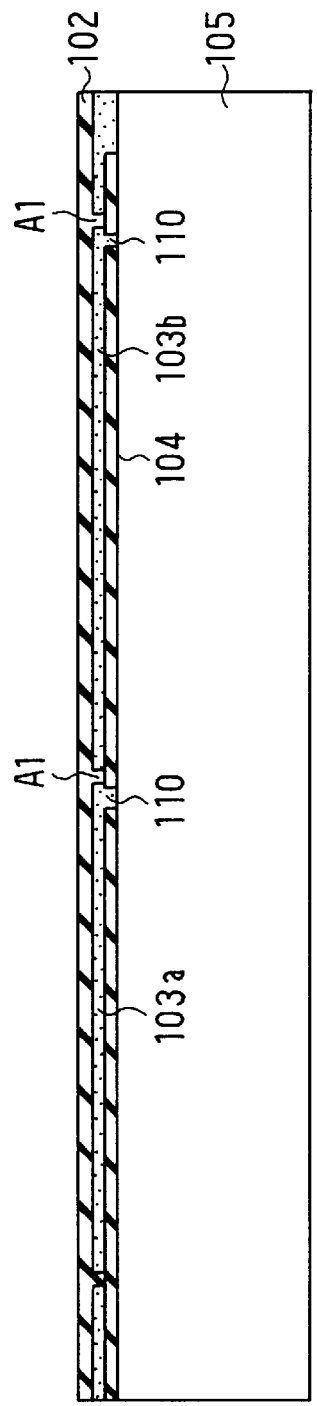

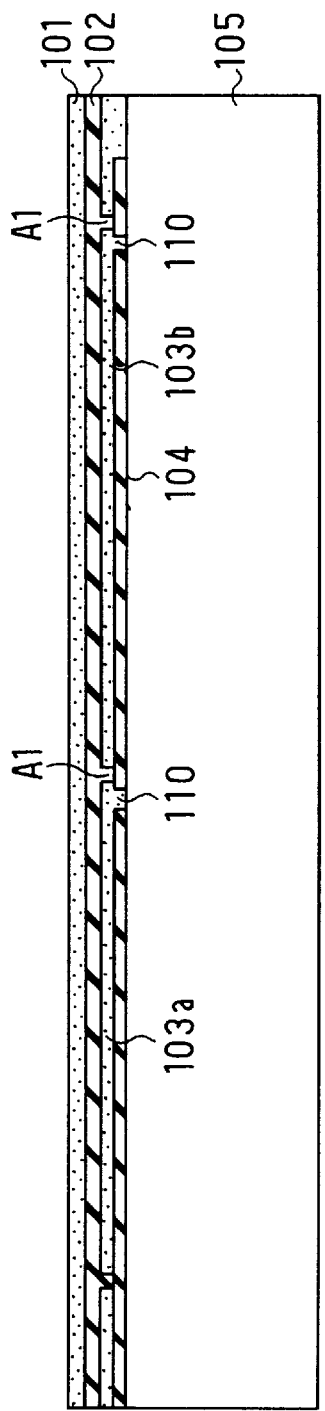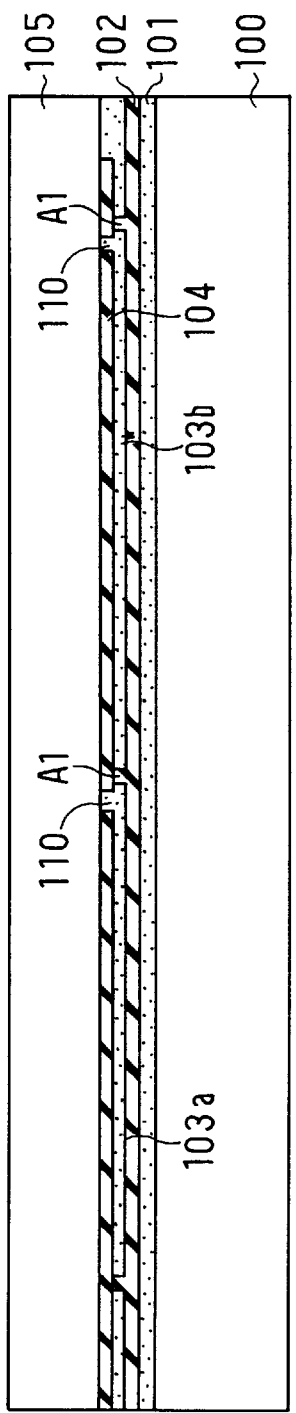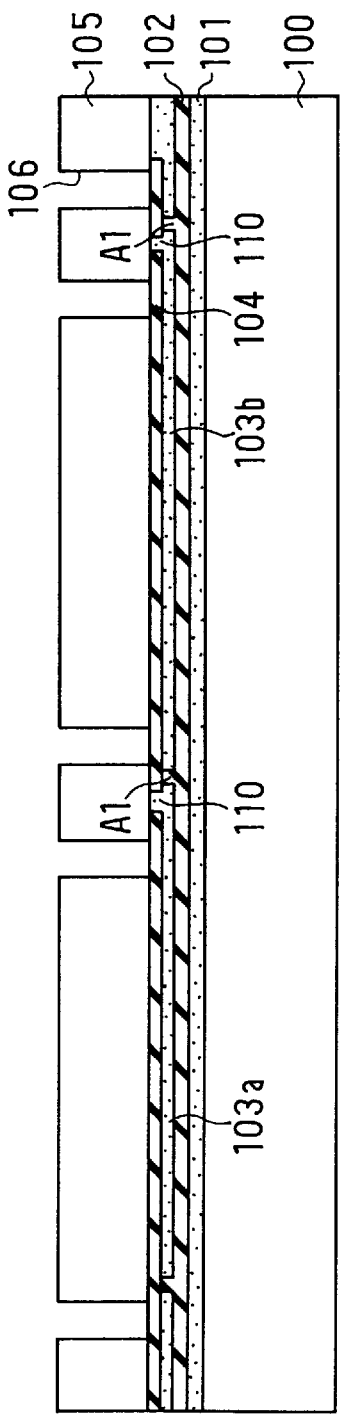

SEMICONDUCTOR DEVICE AND METHOD OF MANUFACTURING THE SAME

CROSS REFERENCE TO RELATED APPLICATIONS

This application is based upon and claims the benefit of priority of the prior Japanese Patent Applications No. 9-302694, filed on Nov. 5, 1997, and No. 10-236135, filed on Aug. 21, 1998, the contents of which are incorporated herein by reference.

BACKGROUND OF THE INVENTION

1. Field of the Invention

This invention relates to a semiconductor device suitable for an SOI (silicon on insulator) structure and having an isolation structure in which elements are isolated from one another by trenches.

2. Description of the Related Art

JP-A-5-136436 discloses a technique related to a high withstand voltage semiconductor device including trenches for dielectric isolation. An oxide film is used as a dielectric layer. Referring to FIG. 32, a silicon layer 202 is disposed on a silicon substrate 200 via a buried silicon oxide film 201, and a silicon island 204 is formed to be surrounded by a silicon oxide film 203 for trench side walls. A semiconductor element such as a LDMOS (lateral double diffusion MOS) transistor or an IGBT (insulated gate bipolar transistor) is formed in the silicon island 204. The silicon oxide films 201, 203 electrically isolate the transistor, and simultaneously support part of a high voltage applied across a drain and the substrate. Electrodes 205 formed on the surface of the transistor are completely and electrically isolated from the silicon substrate 200 by the silicon oxide film 201.

When several power elements are respectively formed in several silicon islands 204 using the technique described above, the thus obtained semiconductor device is suitable for use as a drive circuit capable of providing a high voltage and several power steps. For example, the device can be applied to a drive circuit for flat panel displays such as electroluminescent (EL) displays and plasma displays.

However, when the potential of the silicon substrate 200 is in a floating state, the silicon oxide film 201 does not support any voltage between the drain and the substrate. As a result, it becomes difficult to increase the withstand voltage of the semiconductor device. If an electrode is formed on the back surface of the silicon substrate 200 for applying an electric potential to the substrate 200, a process for TAB mounting or COG (chip on glass) mounting becomes complicated, resulting in increased manufacturing cost and decreased reliability.

SUMMARY OF THE INVENTION

The present invention has been made in view of the above problems. An object of the present invention is to provide a semiconductor device capable of easily applying a substrate potential from a surface of a silicon layer, and a method of manufacturing the same.

Briefly, a semiconductor device according to the present invention has a semiconductor island layer disposed on a substrate through a buried oxide film and having a semiconductor island surrounded by a trench, a first impurity diffused semiconductor layer provided between the buried oxide film and the substrate, and a second impurity diffused semiconductor layer buried in the trench and insulated from the semiconductor island by a side wall oxide film. The second impurity diffused semiconductor layer communicates with the first impurity diffused semiconductor layer. Further, a potential applying electrode is disposed on the second impurity diffused semiconductor layer for applying an electric potential to the first impurity diffused semiconductor layer underlying the semiconductor island.

Accordingly, the electric potential can be applied to the substrate under the buried oxide film directly from the surface of the semiconductor island layer through the first and second impurity diffused semiconductor layers. As a result, when a transistor is formed in the semiconductor island, part of a high voltage applied between a drain electrode of the transistor and the substrate can be supported by the buried oxide film, resulting in increased withstand voltage. Because the trench for isolation is used as a communication passage connecting the substrate and the surface of the semiconductor island layer, it is not necessary to increase an area.

In this case, the semiconductor device can be manufactured by steps of: forming the trench on a main surface of a first semiconductor substrate; forming an oxide film on the main surface including an inside wall of the trench; forming an impurity diffused semiconductor layer on the oxide film and in the trench to fill the trench; flattening a surface of the impurity diffused semiconductor layer on a main surface side of the first semiconductor substrate; bonding the surface of the impurity diffused semiconductor layer of the first semiconductor substrate to a polished surface of a second semiconductor substrate; grinding and polishing a surface of the first semiconductor substrate on an opposite side of the main surface so that a semiconductor island surrounded by the oxide film and the impurity diffused semiconductor layer in the trench is formed; forming a semiconductor element in the semiconductor island; and forming a potential applying electrode on the impurity diffused semiconductor layer.

When the semiconductor island layer has a first semiconductor island in which a semiconductor element is provided and a second semiconductor island isolated from the first semiconductor island by a trench, the electric potential applying electrode may be provided on the second semiconductor island. In this case, the second semiconductor island communicates with the impurity diffused semiconductor layer underlying the buried oxide film through an opening portion of the buried oxide film.

BRIEF DESCRIPTION OF THE DRAWINGS

Other objects and features of the present invention will become more readily apparent from a better understanding of the preferred embodiments described below with reference to the following drawings;

FIGS. 28A–28C, 29A–29C, and 30A–30C are cross-sectional views showing a manufacturing process of the semiconductor device in the sixth embodiment in a stepwise manner;

DETAILED DESCRIPTION OF THE PREFERRED EMBODIMENTS

First Embodiment

Figure 1:
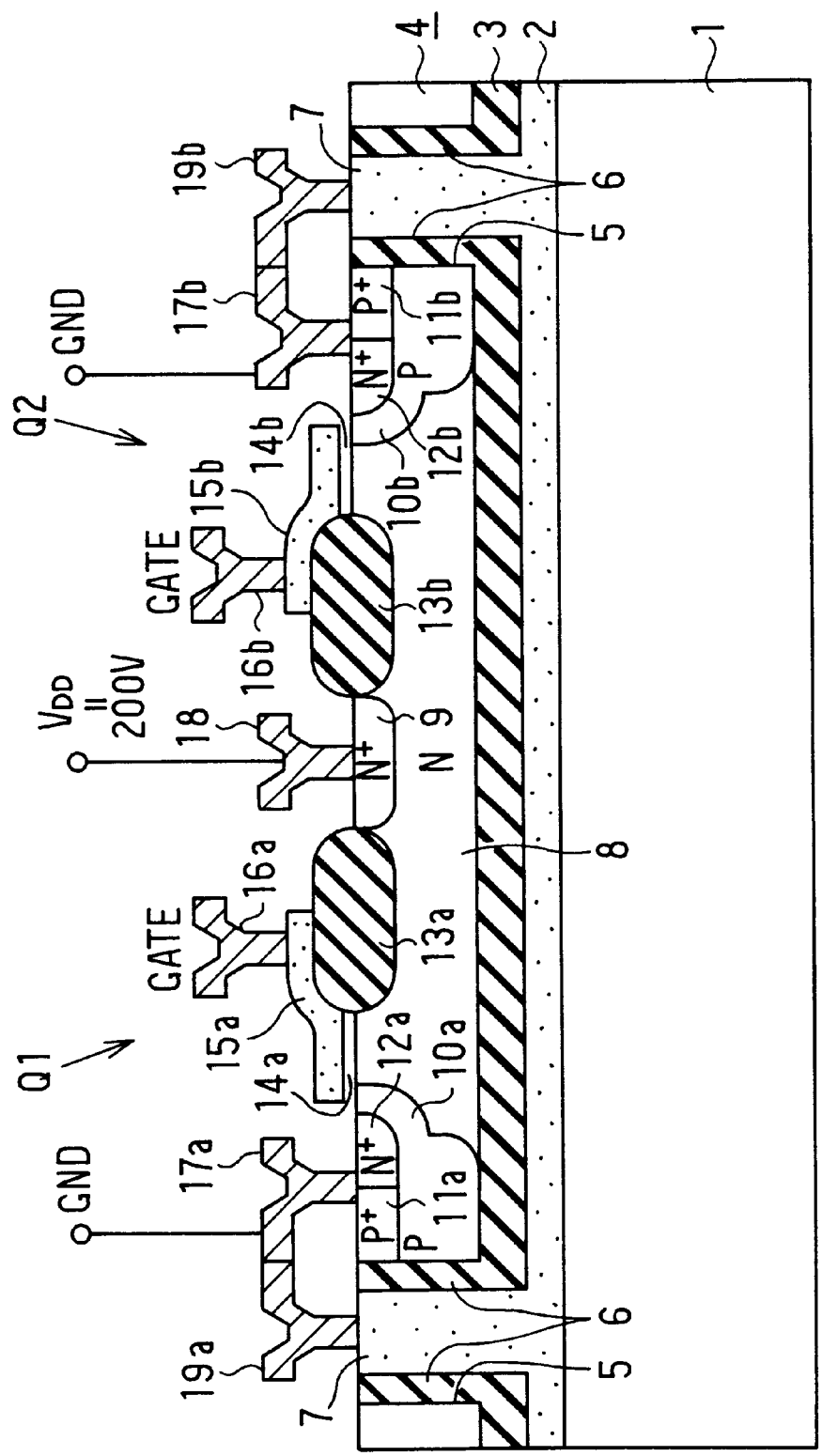
FIG. 1 is a cross-sectional view showing a semiconductor device in a first preferred embodiment.

In a first preferred embodiment, referring to FIG. 1, a semiconductor device having an SOI structure includes high withstand voltage N-channel LDMOS transistors Q1, Q2 formed in a silicon island (silicon island region) 8 as a semiconductor island.

Specifically, a first impurity-doped polysilicon layer (first impurity diffused semiconductor layer) 2 is formed on an N type silicon substrate 1. The first impurity-doped polysilicon layer 2 has a thickness of 0.5 $\mu$m to 10 $\mu$m, and is doped with phosphorus, boron, or arsenic with a concentration of more than $1 \times 10^{18}$ cm$^{-3}$. A buried silicon oxide film 3 having a thickness of 0.5 $\mu$m to 10 $\mu$m is formed on the first impurity-doped polysilicon layer 2, and an N type silicon layer (semiconductor island layer) 4 having a thickness of 0.5 $\mu$m to 50 $\mu$m is formed on the buried silicon oxide film 3.

A trench 5 is formed in the N type silicon layer 4 to surround the silicon island 8. A silicon oxide film 6 for side walls is formed on inside walls of the trench 5, so that the silicon layer 4 exposed in the trench 5 is covered with the silicon oxide film 6. The trench 5 inside of the silicon oxide film 6 is filled with a second impurity-doped polysilicon layer (second impurity diffused semiconductor layer) 7. The second impurity-doped polysilicon layer 7 is, as well as the first impurity-doped polysilicon layer 2, doped with phosphorus, boron, or arsenic with a concentration of more than $1 \times 10^{18}$ cm$^{-3}$. The second impurity-doped polysilicon layer 7 communicates with the first impurity-doped polysilicon layer 2.

Thus, the silicon island 8 surrounded by the impurity-doped polysilicon layers 2, 7 and the silicon oxide films 3, 6, is provided on the N type silicon substrate 1. In practice, several silicon islands 8 of the same kind are formed on the silicon substrate 1. Each of the silicon islands 8 is isolated from one another by the silicon oxide films 3, 6, and is surrounded by the impurity-doped polysilicon layers 2, 7. As shown in the figure, the LDMOS transistors Q1, Q2 and L-IGBTs (lateral insulated gate bipolar transistors) are formed in the respective silicon islands 8.

In the silicon island 8 shown in FIG. 1, an N$^+$ drain region 9 is formed at a specific region in the surface portion of the N type silicon layer 4, and P well regions 10$a$, 10$b$ are formed in the N type silicon layer 4 apart from the N$^+$ drain region 9. P$^+$ source regions 11$a$, 11$b$ and N$^+$ source regions 12$a$, 12$b$ are respectively formed in the P well regions 10$a$, 10$b$. Further, LOCOS oxide films (silicon oxide films) 13$a$, 13$b$ are formed on the upper surface of the N type silicon layer 4 between the N$^+$ drain region 9 and the P well regions 10$a$, 10$b$, respectively. Gate oxide films 14$a$, 14$b$ are respectively provided on the surface of the P well regions 10$a$, 10$b$ and the N type silicon layer 4 between the LOCOS oxide films 13$a$, 13$b$ and the N$^+$ source regions 12$a$, 12$b$, and polysilicon gate electrodes 15$a$, 15$b$ are provided on the gate oxide films 14$a$, 14$b$. The polysilicon gate electrodes 15$a$, 15$b$ extends from the upper surfaces of the LOCOS oxide films 13$a$, 13$b$ to the upper surfaces of the P well regions 10$a$, 10$b$, and are electrically connected to gate electrodes 16$a$, 16$b$. Source electrodes 17$a$, 17$b$ contact the P$^+$ source regions 11$a$, 11$b$, and the N$^+$ source regions 12$a$, 12$b$, respectively. The N$^+$ drain region 9 is electrically connected to a drain electrode 18. The source regions 11$a$, 11$b$, 12$a$, 12$b$ are grounded through the source electrodes 17$a$, 17$b$, and power voltage V$_{DD}$ (for example 200 V) is applied to the drain electrode 18.

Further, electrodes 19$a$, 19$b$ for applying a substrate potential are disposed on the exposed surface of the N type silicon layer 4 to communicate with the second impurity-doped polysilicon layer 7. The electrodes 19$a$, 19$b$ are connected to the source electrodes 17$a$, 17$b$ of the LDMOS transistors Q1, Q2. Accordingly, the electrical field around the source electrodes is lessened, and part of the high voltage applied between the drain electrode and the substrate is supported by the dielectric film (the silicon oxide films 3, 6), resulting in increased withstand voltage of the semiconductor device.

In more detail, the silicon island 8 surrounded by the dielectric film composed of the buried silicon oxide film 3 and the silicon oxide film 6 for the side walls is disposed on the silicon substrate 1. The first impurity-doped polysilicon layer 2 underlies the silicon island 8 and electrically communicates with the electrodes 19$a$, 19$b$ through the second impurity-doped polysilicon layer 7 disposed in the trench 5. In this way, the electric potential can be applied directly from the surface of the N type silicon layer 4, i.e., from the electrodes 19$a$, 19$b$ to the silicon substrate 1 underlying the buried silicon oxide film 3. Accordingly, part of the high voltage applied between the drain electrode and the substrate is applied to the buried oxide film 3, resulting in increase in the withstand voltage of the semiconductor device. The trench 5 is used as a communication passage for connecting the silicon substrate underlying the buried silicon oxide film 3 and the surface of the N type silicon layer 4. Therefore, it is not necessary to increase the area of the semiconductor device.

In addition, as compared to a case where the substrate potential is in a floating state, the electric potential immediately under the buried silicon oxide film 3 of the SOI structure can be fixed by the first and second impurity-doped polysilicon layers 2, 7. Accordingly, the substrate potential is not liable to be varied due to noise and the like, so malfunction does not easily occur. In this case, the impurity-doped polysilicon layers 2, 7 work as shield layers. Further, heat produced by the transistors Q1, Q2 provided in the silicon island 8 is readily radiated through the first and second impurity-doped polysilicon layers 2, 7 and the electrodes 19$a$, 19$b$. Accordingly, a rise in temperature of the semiconductor device, which could cause device malfunction, is prevented. Furthermore, because the electric potential of the substrate 1 is not controlled from the back surface of the substrate 1, it is not necessary that electrodes be formed on the back surface of the substrate 1. Thus, a mounting process, such as TAB mounting or COG mounting, is simplified.

Next, the method of manufacturing the semiconductor device will be explained referring to FIGS. 2–7.

Figure 2:
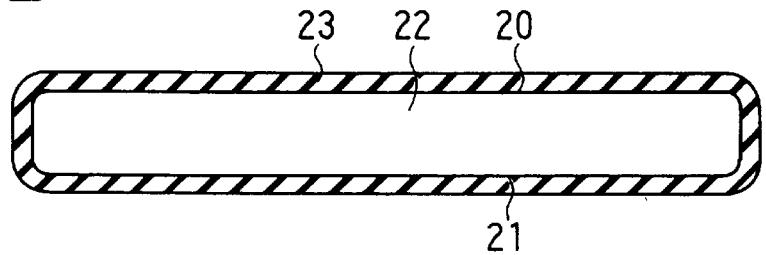
FIGS. 2–7 are cross-sectional views showing a manufacturing process of the semiconductor device in a stepwise manner in the first embodiment.
Figure 3:
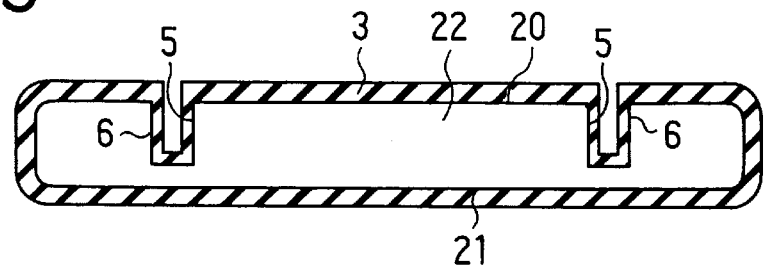

First, as shown in FIG. 2, an N type silicon substrate 22 is prepared as a first semiconductor substrate, and a silicon oxide film 23 with a thickness of 0.5 $\mu$m to 10 $\mu$m is formed to cover the silicon substrate 22 by a thermal oxidization method, a chemical vapor deposition (CVD) method, or combination of the both methods. The silicon oxide film 23 on a main surface 20 of the silicon substrate 22 is patterned by a photo-lithography step for forming the trench 5 (see FIG. 3). Then, the main surface 20 of the silicon substrate 22 is selectively trench-etched using the remaining oxide film 23 as a mask, to form the trench 5 with a depth of 0.5 $\mu$m to 50 $\mu$m. The width of the trench 5 is less than 5 $\mu$m. After that, a silicon oxide film is formed not only on the main surface 22 of the silicon substrate 22 but also on the inside walls of the trench 5 by thermal oxidization. Accordingly, as shown in FIG. 3, the silicon oxide film 3 is provided on the main surface 20 of the silicon substrate 22 and the silicon oxide film 6 is provided on the inside walls of the trench 5.

Figure 4:
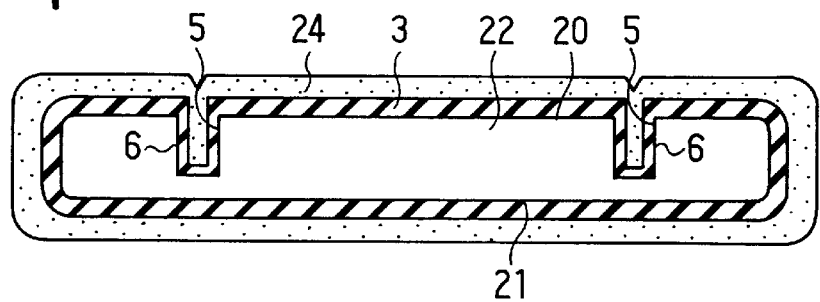
Figure 5:
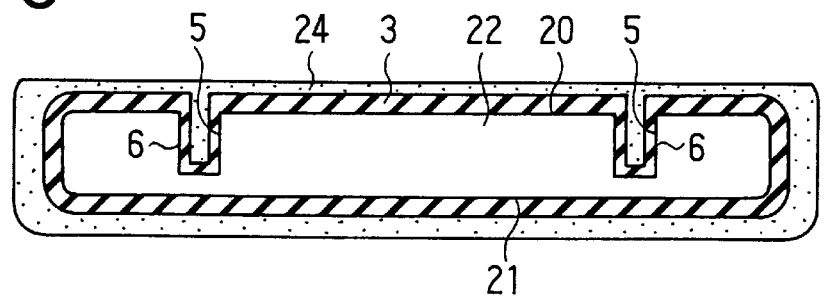

Successively, as shown in FIG. 4, an impurity-doped polysilicon layer 24 doped with phosphorus, boron, or arsenic with a concentration of more than $1\times10^{18}$ cm$^{-3}$ is deposited on the silicon oxide film 3 by CVD or by combination of CVD and ion implantation. The thickness of the impurity-doped polysilicon layer 24 is more than 0.5 $\mu$m to 10 $\mu$m. The trench 5 is filled with the impurity-doped polysilicon layer 24, which is flattened in the following step. Then, as shown in FIG. 5, the impurity-doped polysilicon layer 24 on the main surface side of the silicon substrate 22 is ground and is polished to be flattened by a chemical-mechanical polishing (CMP) technique. The thickness of the remaining impurity-doped polysilicon layer 24 is in a range of 0.5 $\mu$m to 10 $\mu$m.

Figure 6:
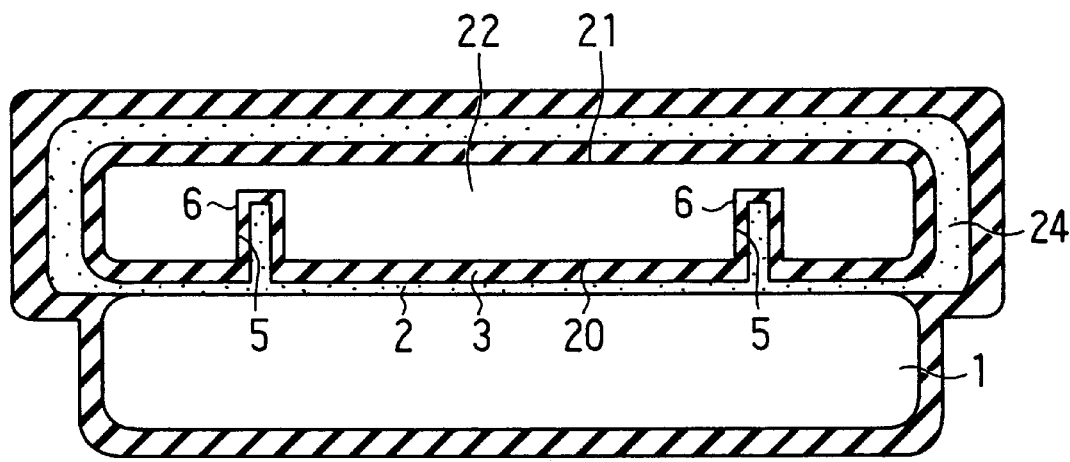
Figure 7:
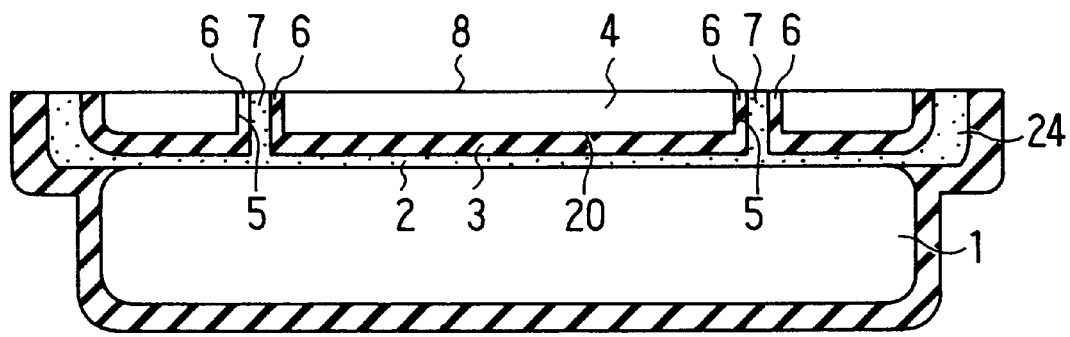

Further, the N type silicon substrate 1, a surface of which is polished, is prepared as a second semiconductor substrate. Then, as shown in FIG. 6, the polished surface (mirror finished surface) of the silicon substrate 1 and the flattened surface (the main surface side) of the silicon substrate 22 are directly bonded to one another by thermal oxidization. After that, a grinding and polishing step is carried out from the side of the back surface 21 of the silicon substrate 22. Accordingly, as shown in FIG. 7, the silicon islands 8 surrounded by the silicon oxide films 3, 6 and the impurity-doped polysilicon layer 24 (2, 7) are provided with a thickness of 0.5 $\mu$m to 50 $\mu$m. Finally, referring again to FIG. 1, elements including the LDMOS transistors Q1, Q2 are provided in the respective silicon islands 8, and the electrodes 19a, 19b for applying the substrate potential are formed on the exposed surface of the impurity-doped polysilicon layer 7. As a result, the semiconductor device shown in FIG. 1 is completed.

Second Embodiment

Next, a second preferred embodiment will be explained focusing on points different from the first embodiment.

Figure 8:
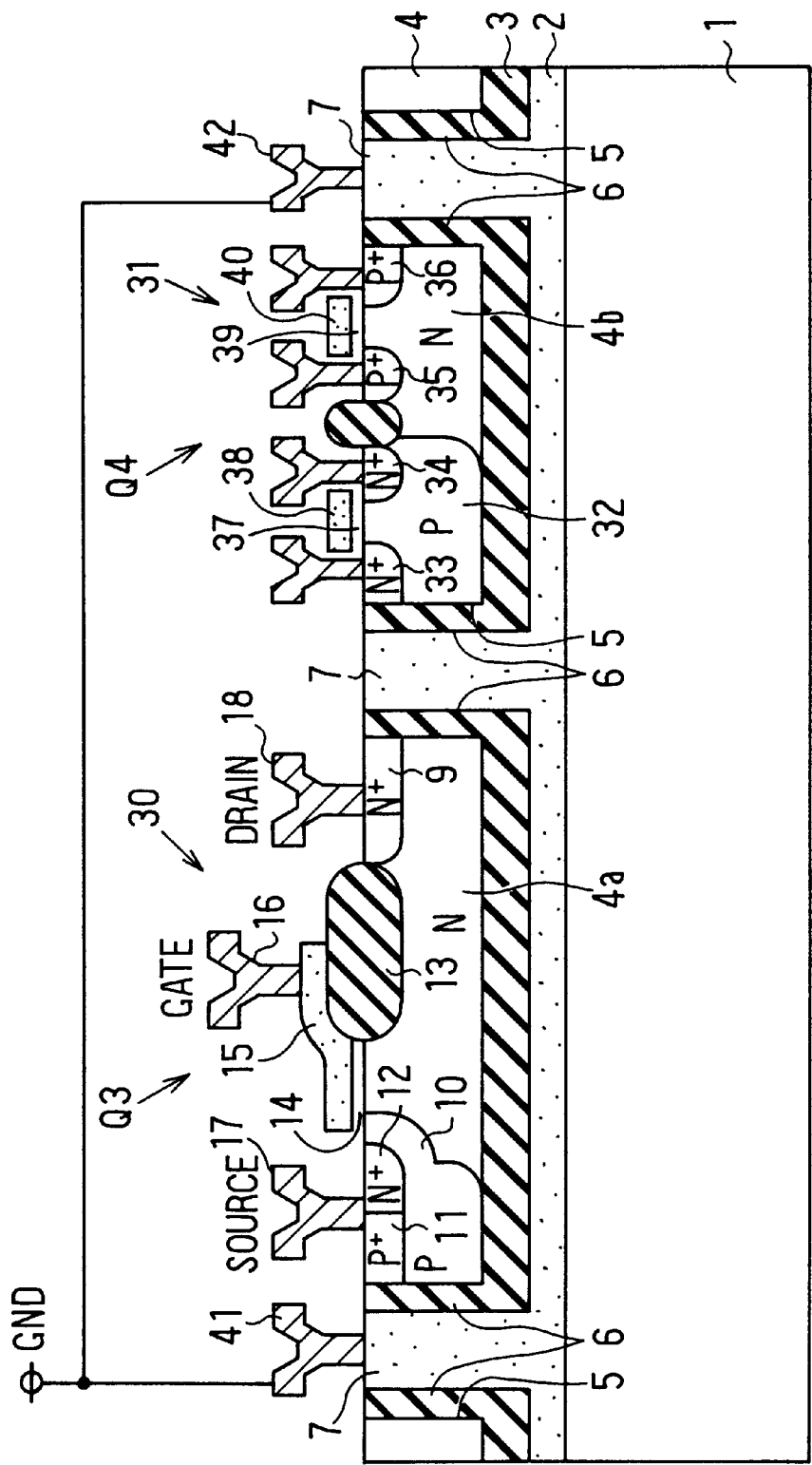
FIG. 8 is a cross-sectional view showing a semiconductor device in a second preferred embodiment.

FIG. 8 shows a semiconductor device in the second embodiment. The semiconductor device has a high withstand voltage N channel LDMOS transistor Q3 formed in a first silicon island 30 and a logical CMOS transistor Q4 formed in a second silicon island 31. Both transistors Q3, Q4 are formed on one chip.

In FIG. 8, an impurity-doped polysilicon layer 2 doped with phosphorus, boron, or arsenic with a concentration of more than $1\times10^{18}$ cm$^{-3}$ is formed on an N type silicon substrate 1 to have a thickness of 0.5 $\mu$m to 10 $\mu$m, and a buried silicon oxide film 3 with a thickness of 0.5 $\mu$m to 10 $\mu$m and an N type silicon layer 4 (4a, 4b) with a thickness of 0.5 $\mu$m to 50 $\mu$m are formed on the impurity-doped polysilicon layer 2 in that order. The trenches 5 are formed in the N type silicon layer 4 to surround the first and second silicon islands 30, 31, and a silicon oxide film 6 is formed on the inside walls of the trenches 5. Further, insides of the silicon oxide film 6 in the trenches 5 are filled with a second impurity-doped polysilicon layer 7. Accordingly, the silicon islands 30, 31 surrounded by the impurity-doped polysilicon layers 2, 7 and the silicon oxide films 3, 6 are provided on the N type silicon substrate 1.

Then, as mentioned above, the high withstand voltage N channel LDMOS transistor Q3 is formed in the first silicon island 30, and the CMOS transistor Q4 constituting a logical circuit is formed in the second silicon island 31. The high withstand voltage N channel LDMOS transistor Q3 has the same constitution as that of the LDMOS transistor Q1 shown in FIG. 1. In the second silicon island 31, a P type region 32 is provided in the N type silicon layer 4b, and N$^+$ regions 33, 34 are formed in the P type region 32. P$^+$ regions 35, 36 are further formed in the N type silicon layer 4b apart from the P type region 32. Further, a gate electrode 38 is formed on the P type region 32 through a gate insulation film 37, and another gate electrode 40 is formed on the N type silicon layer 4b between the P$^+$ regions 35, 36 through a gate insulation film 40.

Electrodes 41, 42 for applying a substrate potential are disposed on exposed surface portions of the second impurity-doped polysilicon layer 7 to communicate with the second impurity-doped polysilicon layer 7. In the present embodiment, the impurity-doped polysilicon layers 2, 7 are grounded through the electrodes 41, 42, and on the other hand, the source electrode 17 of the LDMOS transistor Q3 is set at a specific potential. The other features and effects are the same as those in the first embodiment.

Third Embodiment

Next, a third preferred embodiment will be explained focusing on points different from the second embodiment.

Figure 9:
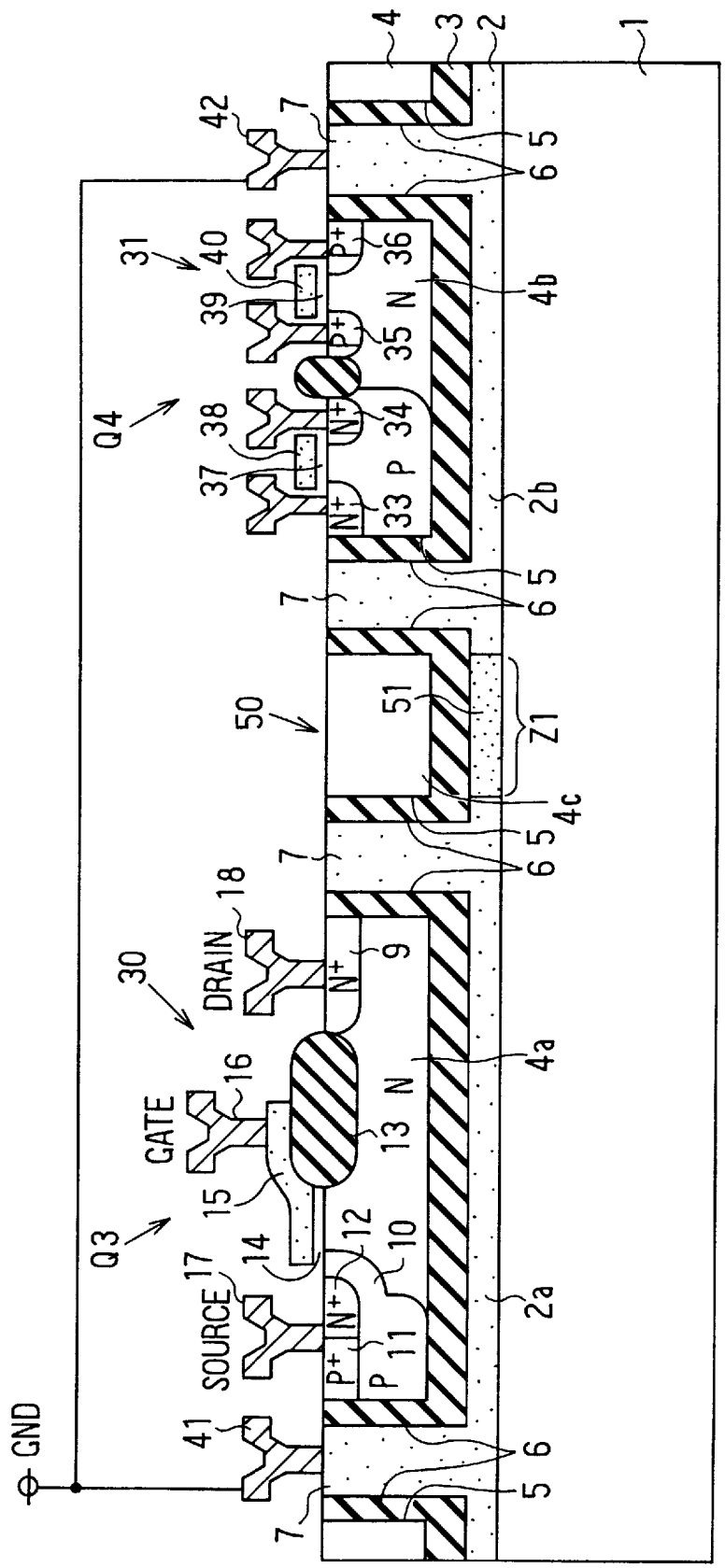
FIG. 9 is a cross-sectional view showing a semiconductor device in a third preferred embodiment.

FIG. 9 shows a semiconductor device in the third embodiment. The semiconductor device has a high withstand voltage N channel LDMOS transistor Q3 provided in a first silicon island 30, and a logical CMOS transistor Q4 provided in a second silicon island 31 as in the second embodiment. Further, a third silicon island 50 is provided between the first and second silicon islands 30, 31 such that the substrate potentials of both transistors Q3, Q4 can be independently controlled.

In FIG. 9, a region Z1 of an impurity-doped polysilicon layer (first conductive type polysilicon layer) 2 is selectively formed to be a reverse conductive type impurity-doped polysilicon layer (second conductive type polysilicon layer) 51. Accordingly, an impurity-doped polysilicon layer 2a underlying the high withstand voltage N channel LDMOS transistor Q3 and an impurity-doped polysilicon layer 2b underlying the logical CMOS transistor Q4 are electrically isolated from one another. Electrodes 41, 42 for applying a substrate potential can independently apply electric potentials to the respective polysilicon layers 2a, 2b.

According to this structure, the impurity-doped polysilicon layer (shield layer) 2a for the high withstand voltage system and the impurity doped polysilicon layer (shield layer) 2b for the logical circuit system are independent from one another to prevent mutual interference. The silicon island 30 in which the withstand voltage system element Q3 is formed is electrically independent from the silicon island 31 in which the logical circuit system element Q4 is formed. In the present embodiment shown in FIG. 9, the electrodes 41, 42 for applying the substrate potential are grounded; however, the islands are not liable to be affected by mutual noises due to the impurity-doped polysilicon layer 51.

The impurities such as phosphorus, boron, or arsenic are selectively doped into the impurity-doped polysilicon layer 2 by photo-lithography and ion implantation, or by oxidization, CVD deposition, photo-lithography, and impurity diffusion. Specifically, as shown in FIG. 5, after the surface of the impurity-doped polysilicon layer 2 is flattened, the impurities are doped into the region Z1 of the polysilicon layer 2 (24) so that the reverse conductive type impurity-doped polysilicon layer is formed in the region Z1. Instead of the reverse conductive type impurity-doped polysilicon layer, a non-doped polysilicon layer (intrinsic polysilicon layer) may be disposed in the region Z1. Even in this case, electrical isolation can be provided as mentioned above.

Fourth Embodiment

Next, a fourth preferred embodiment will be explained focusing on points different from the third embodiment.

Figure 10:
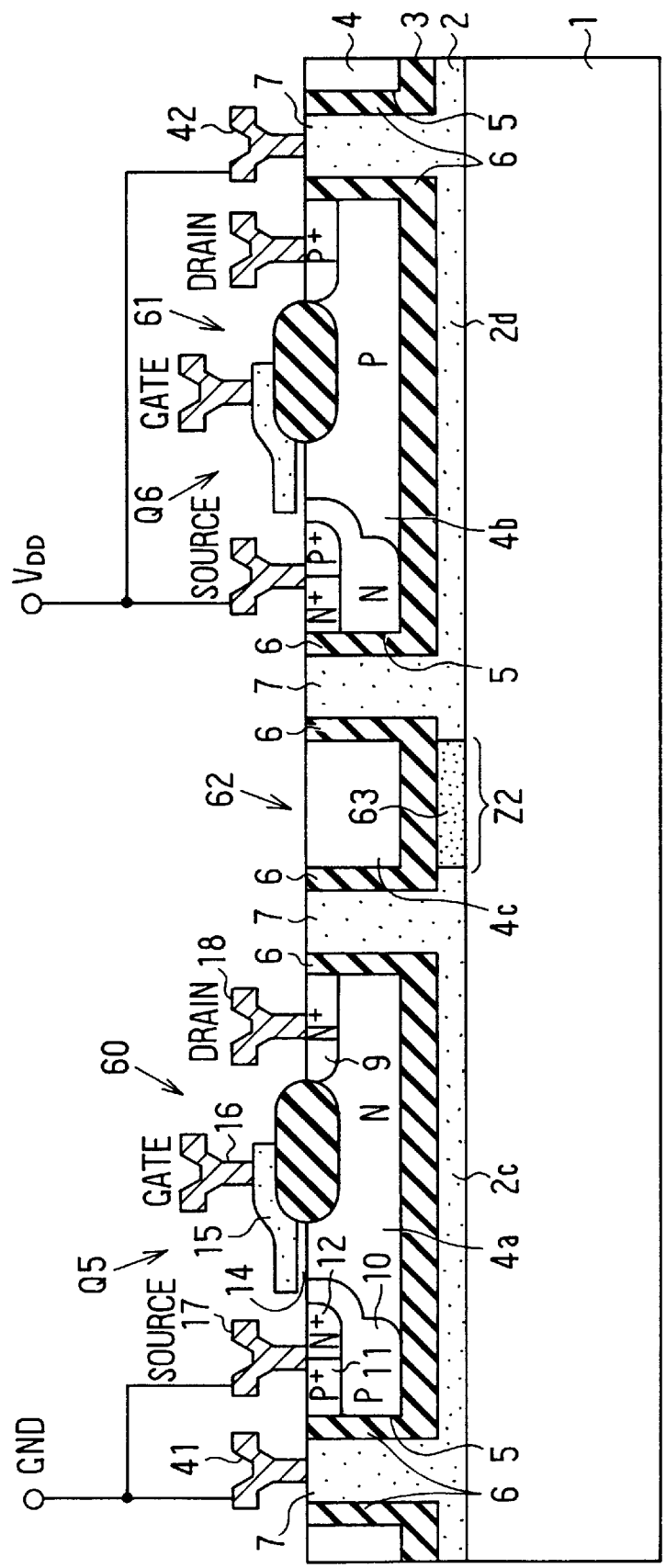
FIG. 10 is a cross-sectional view showing a semiconductor device in a fourth preferred embodiment.

FIG. 10 shows a semiconductor device in the present embodiment. In the semiconductor device, a high withstand voltage N channel LDMOS transistor Q5 is formed in a first silicon island 60, and a high withstand voltage P channel LDMOS transistor Q6 is formed in a second silicon island 61. Accordingly, an inverter constitution composed of both transistors Q5, Q6 is formed on one chip. Further, a third silicon island 62 is formed between the first silicon island 60 and the second silicon island 61 so that substrate potentials are independently controlled.

In FIG. 10, a reverse conductive type impurity-doped polysilicon layer (second conductive type polysilicon layer) 63 is selectively formed in a region Z2 of an impurity-doped polysilicon layer (first conductive type polysilicon layer) 2 underlying the third silicon island 62. Otherwise, the region Z2 may be a non-doped polysilicon layer (intrinsic polysilicon layer). Accordingly, an impurity-doped polysilicon layer 2c underlying the high withstand voltage N channel LDMOS transistor Q5 and an impurity-doped polysilicon layer 2d underlying the high withstand voltage P channel LDMOS transistor Q6 are electrically isolated from one another. As a result, specific potentials can be independently applied to the polysilicon layers 2c, 2d.

According to this structure, a substrate potential and a source potential of the high withstand voltage N channel LDMOS transistor Q5 are set at a GND potential. A substrate potential and a source potential of the high withstand voltage P channel LDMOS transistor Q6 are set at a power voltage $V_{DD}$ (for example 200V). Accordingly, when part of a high voltage of the inverter constitution composed of the P channel and N channel transistors is supported by the insulation film (silicon oxide films 3, 6), the withstand voltage can be effectively increased.

A case where the reverse conductive type impurity-doped polysilicon layer 63 is not provided in the impurity-doped polysilicon layer 2 is considered. In this case, when the substrate 1 is grounded so that part of the high voltage of the inverter constitution composed of the P channel and N channel transistors is supported by the buried silicon oxide film 3, a high voltage is applied between the source electrode and the substrate 1 on the P channel transistor side. This makes increase of the withstand voltage difficult. As opposed to this, in the present embodiment, the substrate potential of the N channel transistor Q5 and the substrate potential of the P channel transistor Q6 are independently set, resulting in increase of the withstand voltage.

Fifth Embodiment

Next, a fifth preferred embodiment will be explained focusing on points different from the first embodiment.

Figure 11:
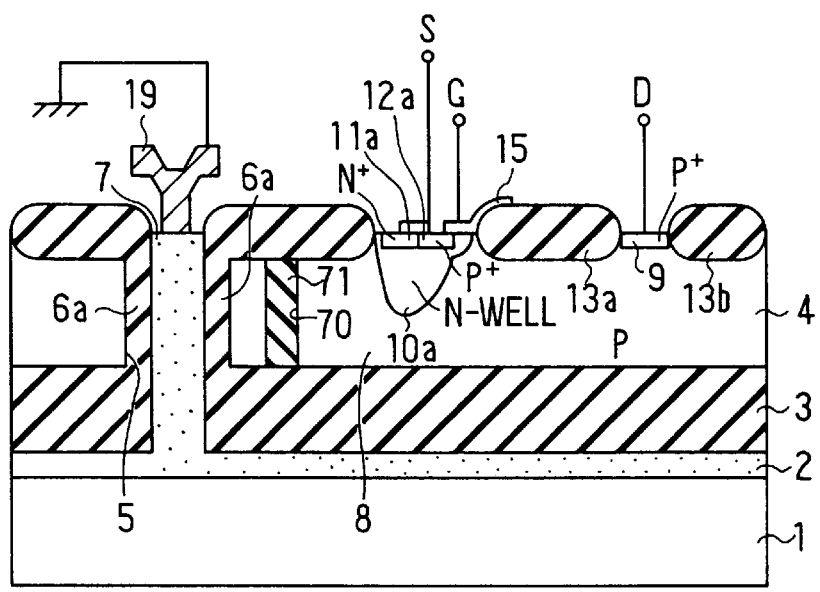
FIG. 11 is a cross-sectional view showing a semiconductor device in a fifth preferred embodiment.

FIG. 11 shows a P type semiconductor device in the present embodiment. The semiconductor device has a structure in which a large electrical field produced between an activation region (N well region) 10a of a transistor formed in a silicon island and a side wall oxide film 6a is lessened with a small area.

In an SOI structure having an electrode 19 for applying a substrate potential on a surface side of the substrate 1, when a potential difference between the substrate 1 and the activation region 10a is in a range of ten volts to several hundred volts, i.e., when a potential difference between the trench 5 for applying the electric potential to the substrate 1 and the activation region 10a adjacent to the trench 5 is in a range of ten volts to several hundred volts, another trench 70 is formed between the side wall oxide film 6a of the trench 5 and the adjacent activation region 10a. The inside of the trench 70 is filled with insulation material (oxide film) 71. The large electric field produced between the transistor activation region (N well region) 10a and the side wall oxide film 6a can be lessened by the trench 70 with a small area. Not only one trench but several trenches can be formed between the side wall oxide film 6a and the activation region 10a.

Figure 12:
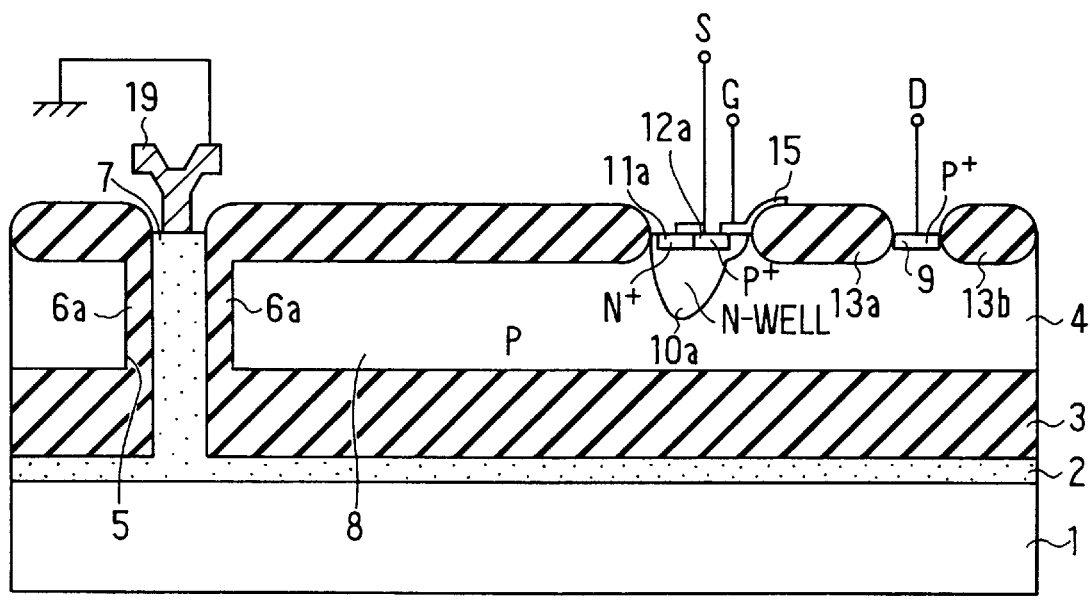
FIG. 12 is a cross-sectional view showing a semiconductor device for comparison.

In more detail, as shown in FIG. 12, in an SOI structure having the electrode 19 for applying the electric potential to the substrate from the surface of the silicon layer 4 without having the trench 70, there also arise a case where a potential difference between the substrate 1 and the activation region 10a is in a range of ten volts to several hundred volts. In such a case, the electric field between the substrate 1 and the activation region 10a is lessened at the side wall oxide film 6a and at a PN junction face between the activation region (N well region) 10a and the P type silicon layer 4. Therefore, when the large potential difference in the range of ten volts to several hundred volts is produced, an interval between the side wall oxide film 6a and the PN junction face must be sufficiently provided so that the field intensity therebetween does not exceed approximately $3 \times 10^5$ V/cm (the maximum field intensity of silicon). As a result, the element area is increased to decrease the integration rate.

Therefore, in the present embodiment, one or several trenches 70 filled with the silicon oxide film having the maximum field intensity of approximately $6 \times 10^6$ V/cm, which is approximately 20 times larger than that of silicon, is or are provided between the side wall oxide film 6a of the trench 5 and the activation region 10a adjacent to the oxide film 6a. As a result, the electric field can be lessened with an area which is approximately one-twentieth of that necessary for the structure shown in FIG. 12.

Next, a manufacturing method will be explained referring to FIGS. 13–24 as an example.

Figure 13:
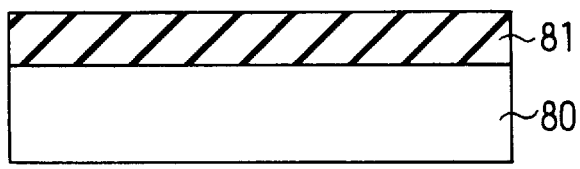
FIGS. 13–24 are cross-sectional views showing a manufacturing process of the semiconductor device in the fifth embodiment.
Figure 14:
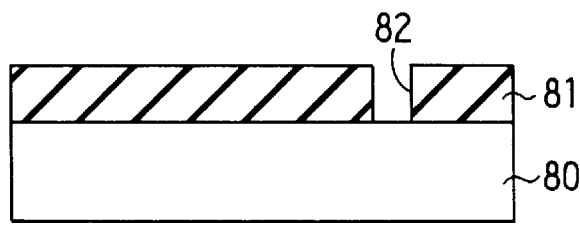

First, as shown in FIG. 13, an oxide film 81 is formed on a silicon substrate 80, and as shown in FIG. 14 an opening portion 82 is formed in a specific region of the oxide film 81.

Figure 15:
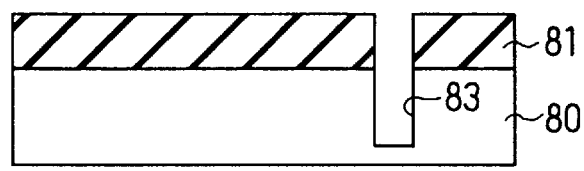
Figure 16:
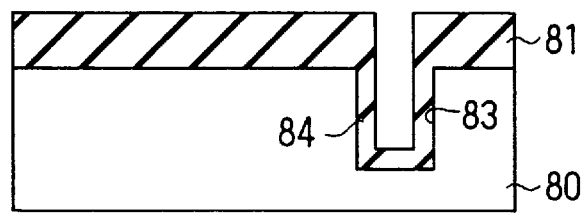
Figure 17:
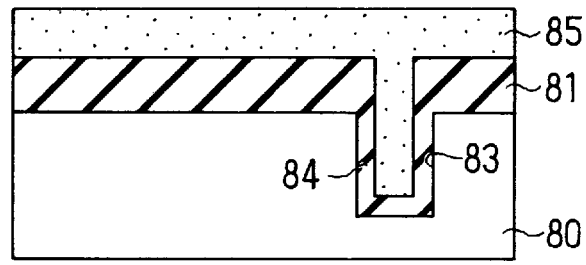
Figure 18:
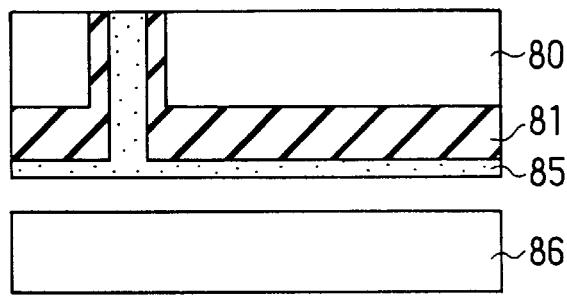
Figure 19:
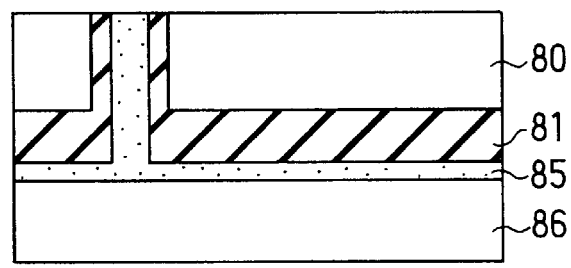

Then, as shown in FIG. 15, the silicon substrate 80 is etched through the opening portion 82 to form a groove 83, and as shown in FIG. 16 an oxide film 84 is formed on the inside walls of the groove 83. Successively, as shown in FIG. 17, a polysilicon thin film 85 is deposited on the silicon substrate 80 to fill the groove 83, and the surface of the polysilicon thin film 85 is flattened. Then, as shown in FIG. 18, the silicon substrate 80 is ground and is polished from the surface on a side opposite to the polysilicon thin film 85 until the bottom face of the groove 83 is exposed. As shown in FIG. 19, the surface of the polysilicon thin film 85 is bonded to a surface of a silicon substrate 86.

Figure 20:
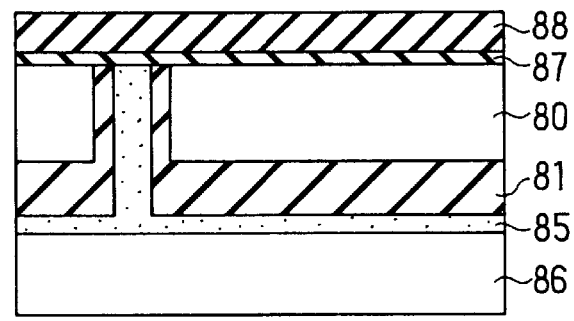
Figure 21:
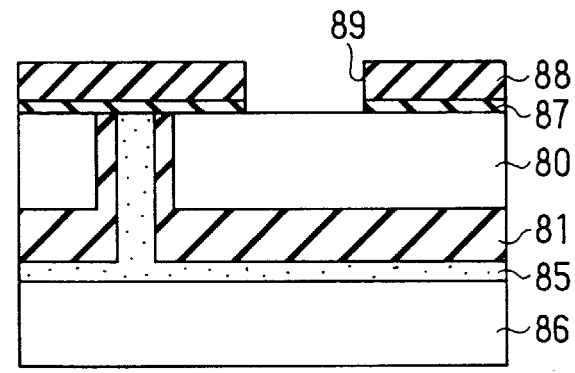
Figure 22:
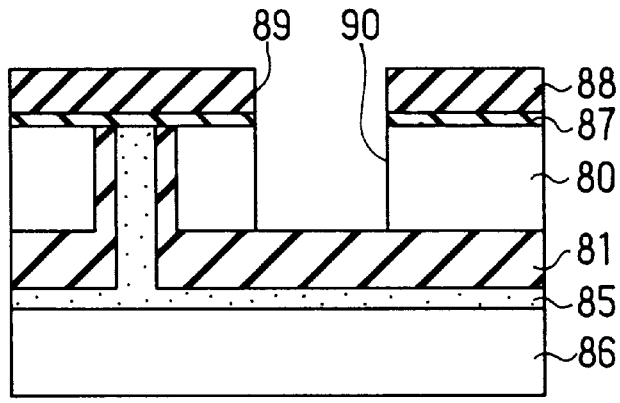
Figure 23:
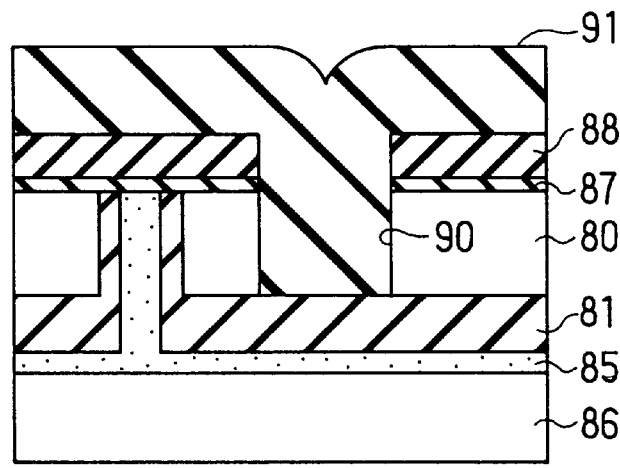
Figure 24:
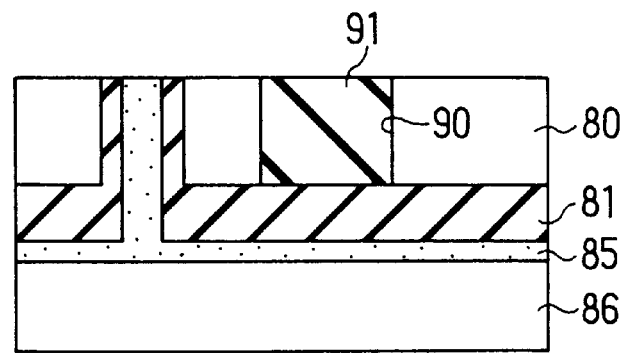

After that, as shown in FIG. 20, a silicon nitride (SiN) film 87 with a thickness of for example 0.15 μm is deposited on the surface of the silicon substrate 80 by a CVD method or the like, and a silicon oxide film 88 (for example a CVD oxide film such as TEOS) is deposited thereon. Then, as shown in FIG. 21, after masking is carried out using resist by a photo-lithography step, the silicon nitride film 87 and the silicon oxide film 88 are etched to form an opening portion 89 therein. After that, the resist is removed. Next, as shown in FIG. 22, the silicon substrate 80 is etched through the opening portion 89 to form a trench 90. Then, as shown in FIG. 23, a silicon oxide film 91 (for example TEOS) is deposited to be buried in the trench 90. Next, after the surface is polished using the silicon nitride (SiN) film 87 as a mask by a method for forming a generally well-known STI (shallow trench isolation) structure, as shown in FIG. 24, the silicon nitride film 87 is removed by a phosphoric acid treatment. After that, as shown in FIG. 11, LOCOS oxidization is carried out and the semiconductor elements are formed.

Figure 25:
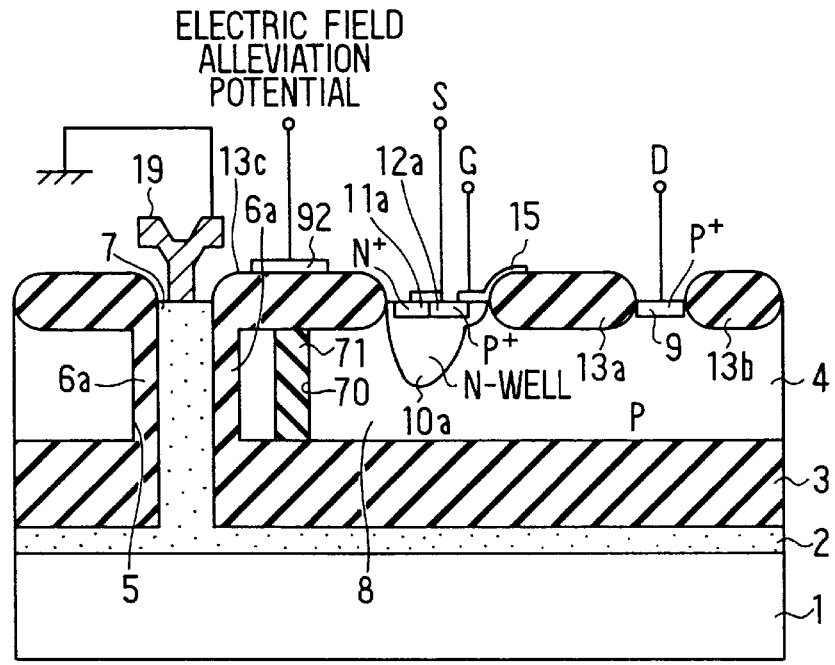
FIG. 25 is a cross-sectional view showing a modified example of the semiconductor device in the fifth embodiment.

A modified example of the present embodiment is shown in FIG. 25. Specifically, an electrode (field plate) 92 is formed on a LOCOS oxide film (field oxide film) 13c which is disposed on the trench 70 for alleviating an electric field. An electric field alleviation potential is applied to the electrode 92 to control distribution of the electric field. The electrode 92 is made of polysilicon or the like. Accordingly, the electric field between the activation region 10a and the side wall oxide film 6a can be lessened.

Figure 26:
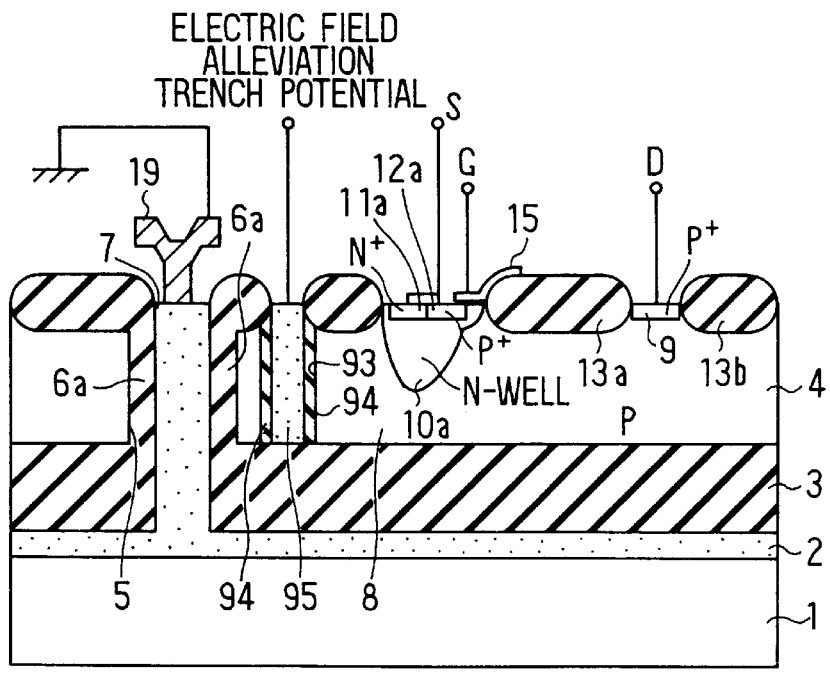
FIG. 26 is a cross-sectional view showing another modified example of the semiconductor device in the fifth embodiment.

Another modified example is shown in FIG. 26. In FIG. 26, a trench 93 for alleviating the electric field is provided instead of the trench 70. A silicon oxide film 94 is formed on inside walls of the trench 93, and an impurity-doped polysilicon 95 is buried inside of the silicon oxide film 94 in the trench 93. The number of such a trench is not limited to only one, and several trenches may be formed in the region where a large potential difference is produced. At that time, electric potentials are respectively applied to the respective trenches so that the distribution of the electric field is controlled. Thus, when at least one trench 93 filled with the conductive material 95 is provided between the activation region 10a and the side wall oxide film 6a and the conductive material 95 is fixed at a specific potential, the electric field between the activation region 10a and the side wall oxide film 6a can be lessened.

Sixth Embodiment

Next, a sixth preferred embodiment will be explained focusing on points different from the third embodiment.

Figure 27:
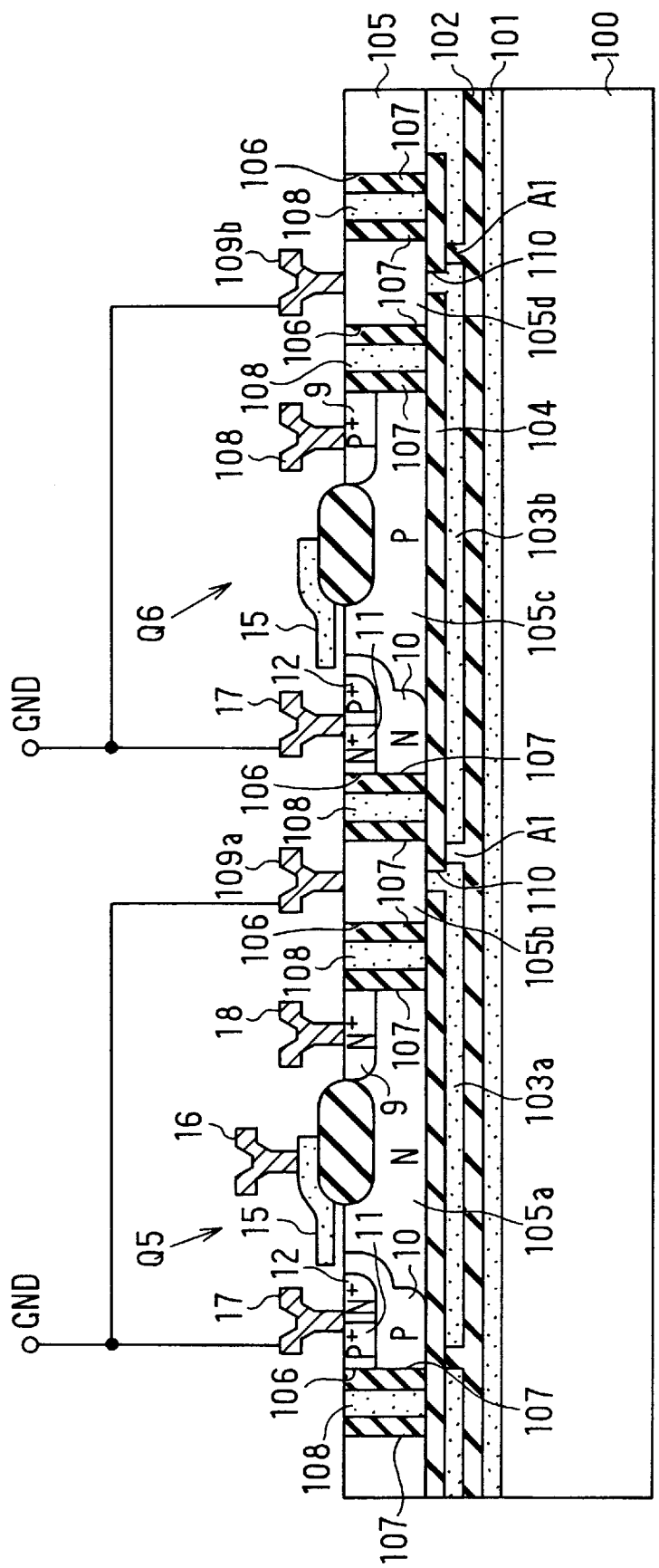
FIG. 27 is a cross-sectional view showing a semiconductor device in a sixth embodiment.

FIG. 27 shows a semiconductor device in the present embodiment. The semiconductor device is modified from the device shown in FIG. 9 to be miniaturized. The semiconductor device has an SOI structure in which a high withstand voltage LDMOS transistors Q5, Q6 are respectively formed in silicon islands (silicon island regions) 105a, 105c. In FIG. 27, a thin film (bonding film) 101 for bonding, a silicon oxide film 102, an impurity-doped polysilicon layers (impurity diffused semiconductor layers) 103a, 103b, a buried silicon oxide film 104 are formed on an N type silicon substrate 100 as a semiconductor substrate in that order. The impurity-doped polysilicon layers 103a, 103b are doped with phosphorus, boron, or arsenic.

A silicon layer 105 is formed on the buried silicon oxide film 104, and trenches 106 are formed in the silicon layer 105 so that the silicon layer 105 is partitioned into silicon islands 105a–105d by the trenches 106. Further, a silicon oxide film 107 for side walls is formed on the inside walls of the trenches 106 so that the silicon layer 105 exposed in the trenches 106 is covered with the silicon oxide film 107. The trenches 106 covered with the silicon oxide film 107 are then filled with a polysilicon layer 108.

The impurity-doped polysilicon layer 103a underlying the silicon island 105a serving as a transistor island is extended to be disposed under the adjacent silicon island 105b and is electrically connected to the silicon island 105b through an opening portion 110 of the buried silicon oxide film 104. Likewise, the impurity-doped polysilicon layer 103b underlying the silicon island 105c serving as a transistor island is extended to be disposed under the silicon island 105d and is electrically connected to the silicon island 105d through an opening portion 110 of the buried silicon oxide film 104. The impurity-doped polysilicon layers 103a, 103b are isolated from one another by a silicon oxide film A1.

The silicon islands 105b, 105d respectively have electrodes 109a, 109b on the surfaces thereof for applying substrate potentials. The electrodes 109a, 109b are respectively connected to source electrodes 17 of the high withstand voltage LDMOS transistors Q5, Q6. Accordingly, an electric field around a source can be lessened, and part of a high voltage applied across a drain and the substrate can be supported by a dielectric film (silicon oxide films 104, 107), resulting in high withstand voltage of the semiconductor elements. Further, as well as the case shown in FIG. 9, each substrate potential of each semiconductor island is independently controlled. That is, the potential on the back face of the element provided in the SOI substrate structure can be controlled from the substrate surface, and the substrate potentials of the semiconductor islands 105a, 105c adjacent to one another on the identical substrate can be independently controlled.

Here, the characteristics of the isolation structure by the silicon oxide film A1 shown in FIG. 27 will be explained as compared to the isolation structure by the non-doped semiconductor layer 51 shown in FIG. 9.

In the case shown in FIG. 9, the impurities doped into the impurity-doped semiconductor layers 2a, 2b adjacent to the non-doped semiconductor layer 51 are liable to be diffused into the non-doped semiconductor layer 51. Therefore, when an isolation width is small, the electrical isolation between the two semiconductor islands may not be maintained. Also, in the device shown in FIG. 9, the electrodes 41, 42 for applying the substrate potentials are directly disposed on the impurity-doped polysilicon 7 buried in the trenches. Therefore, when the trench width is widened, the impurity-doped polysilicon film needs be more than half as thick as that of the trench width. For example, when it is necessary for the impurity-doped polysilicon film to have a thickness more than 4 μm to 5 μm, the formation step increases fabrication time and material cost.

As opposed to this, in FIG. 27, the impurity diffused semiconductor layers 103a, 103b underlying the semiconductor islands 105a, 105c are securely isolated from one another by the insulation film A1 intervening therebetween. That is, in FIG. 9, when the impurities (phosphorus, for example) are diffused from the adjacent impurity-doped polysilicon layers 2a, 2b into the non-doped semiconductor layer 51 so that the concentration of phosphorus in the semiconductor layer 51 becomes approximately $2 \times 10^{19}$ cm$^{-3}$, the semiconductor layer 51 works as a conductive member having a sheet resistance of approximately $1 \times 10^8$ Ω/□. However, when the polysilicon is exchanged with an oxide layer as the insulation layer, even if the impurities are diffused, the electrical isolation by the insulation layer is maintained.

Thus, according to the present embodiment, the two impurity-doped polysilicon layers 103a, 103b are fully electrically isolated from one another by the insulation oxide film A1. In addition, concerning the polysilicon 108 filling the trenches 106, even when the trench width is wide, for example more than 8 μm to 10 μm, the polysilicon 108 can be buried in the trenches 106 by a well-known trench burying method.

Next, a manufacturing method will be explained referring to FIGS. 28–30 as an example.

First, as shown in FIG. 28A, the silicon substrate 105 is prepared as a first semiconductor substrate, and the buried silicon oxide film 104 is formed on the main surface of the silicon substrate 105 by thermal oxidization or a CVD method. Then, after masking is carried out by a photo-lithography step, the silicon oxide film 104 is etched to form the opening portions 110 exposing the surface of the silicon substrate 105 therefrom. The opening portions 110 are for applying the substrate potentials through the second island formation regions (the islands 105b, 105d in FIG. 27) adjacent to the first island formation regions (the islands 105a, 105c in FIG. 27).

Further, as shown in FIG. 28B, the impurity-doped polysilicon thin film (impurity-doped semiconductor layer) 103 is deposited not only in the opening portions 110 but also on the buried silicon oxide film 104. After masking is carried out by the photo-lithography step, specific regions of the impurity-doped polysilicon thin film 103 is etched to have patterns 103a, 103b and opening portions 111. The opening portions 111 are formed at boundaries of regions for independently applying the substrate potentials.

Successively, as shown in FIG. 28C, the insulating silicon oxide film 102 is formed not only in the opening portions 111 but also on the impurity-doped polysilicon thin films 103a, 103b by the CVD method or the like. Further, as shown in FIG. 29A, the polysilicon thin film 101 for bonding is deposited on the silicon oxide film 102. As shown in FIG. 29B, after the surface of the polysilicon thin film 101 is ground and polished to be flattened, the polished surface of the polysilicon thin film 101 and the polished surface of the silicon substrate 100 as a second semiconductor substrate are directly bonded to one another.

Figure 30A:
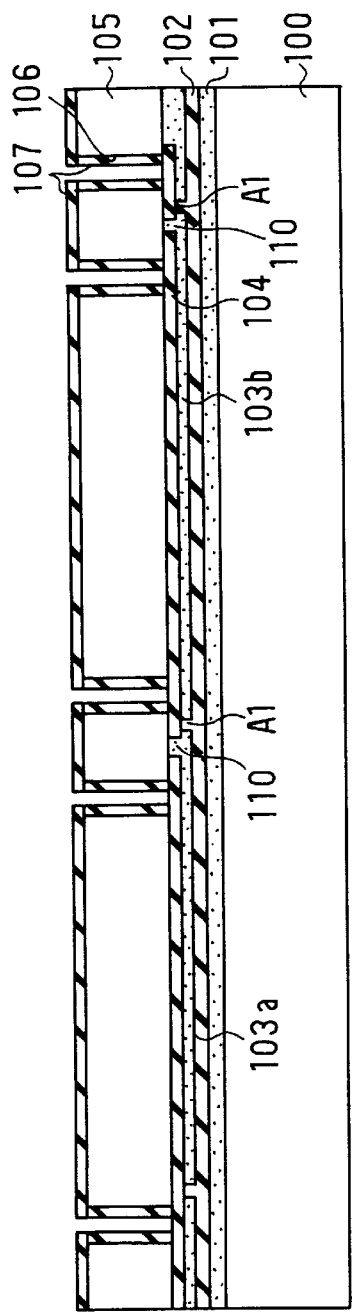
Figure 30B:
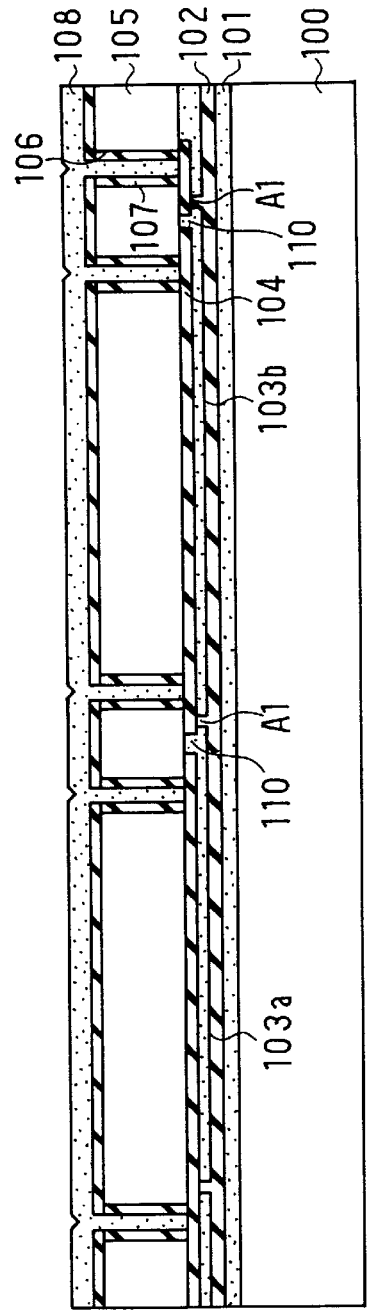
Figure 30C:
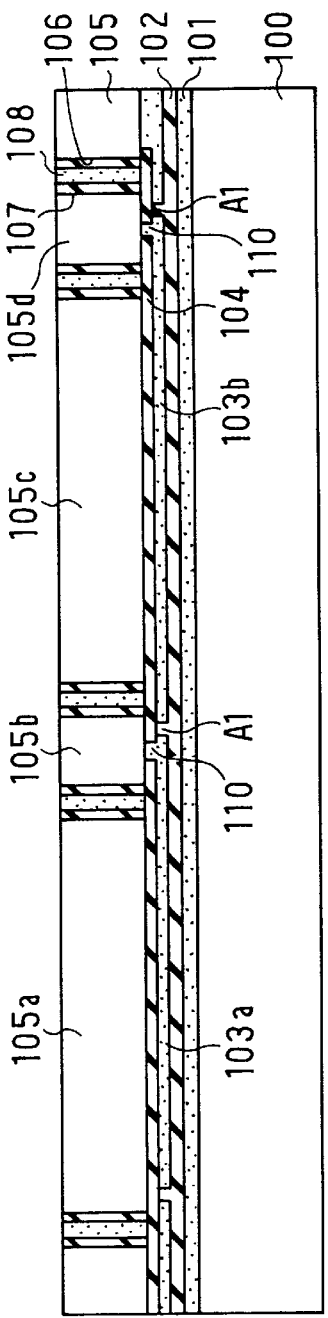

Further, as shown in FIG. 29C, the silicon substrate 105 is ground and polished from the back surface thereof, and is etched to form the trenches 106 for the element isolation therein. Next, as shown in FIG. 30A, the oxide film 17 is formed on the surface of the silicon substrate 105 including the inside walls of the trenches 106. After that, as shown in FIG. 30B, the polysilicon thin film 108 for filling the trenches 106 is deposited on the oxide film 107 and in the trenches 106 to be buried in the trenches 106. After that, as shown in FIG. 30C, the surface of the silicon substrate 105 is ground and polished to be flattened again. Accordingly, the first silicon islands 105a, 105c respectively disposed on the impurity-doped polysilicon thin films 103a, 103b through the buried oxide film 104 are provided, and at the same time, the second silicon islands 105b, 105d electrically connected to the impurity-doped polysilicon thin films 103a, 103b are provided.

Then, as shown in FIG. 27, the transistors Q5, Q6 are formed in the first silicon islands 105a, 105b as the semiconductor elements, and the electrodes 109a, 109b for applying the substrate potentials are formed on the second silicon islands 105b, 105d.

Figure 31:
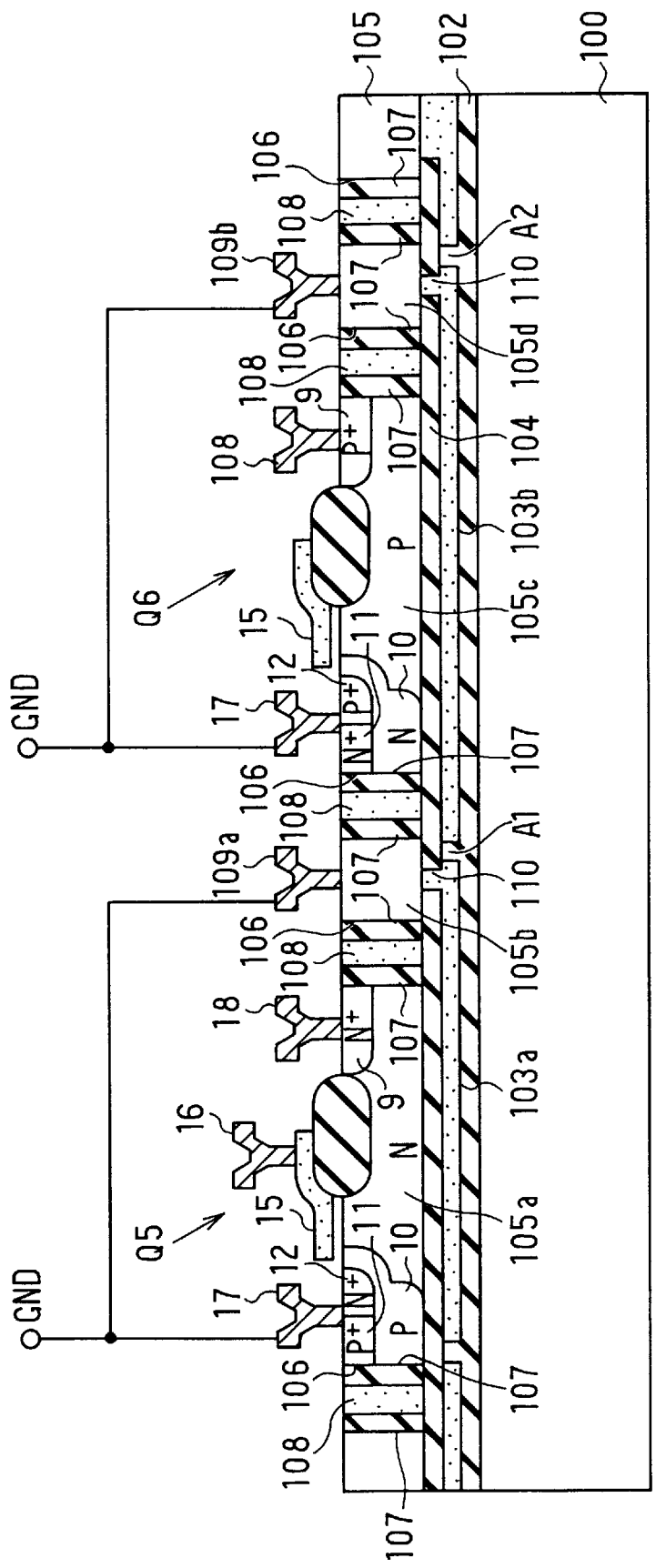
FIG. 31 is a cross-sectional view showing a modified example of the semiconductor device in the sixth embodiment.
Figure 32:
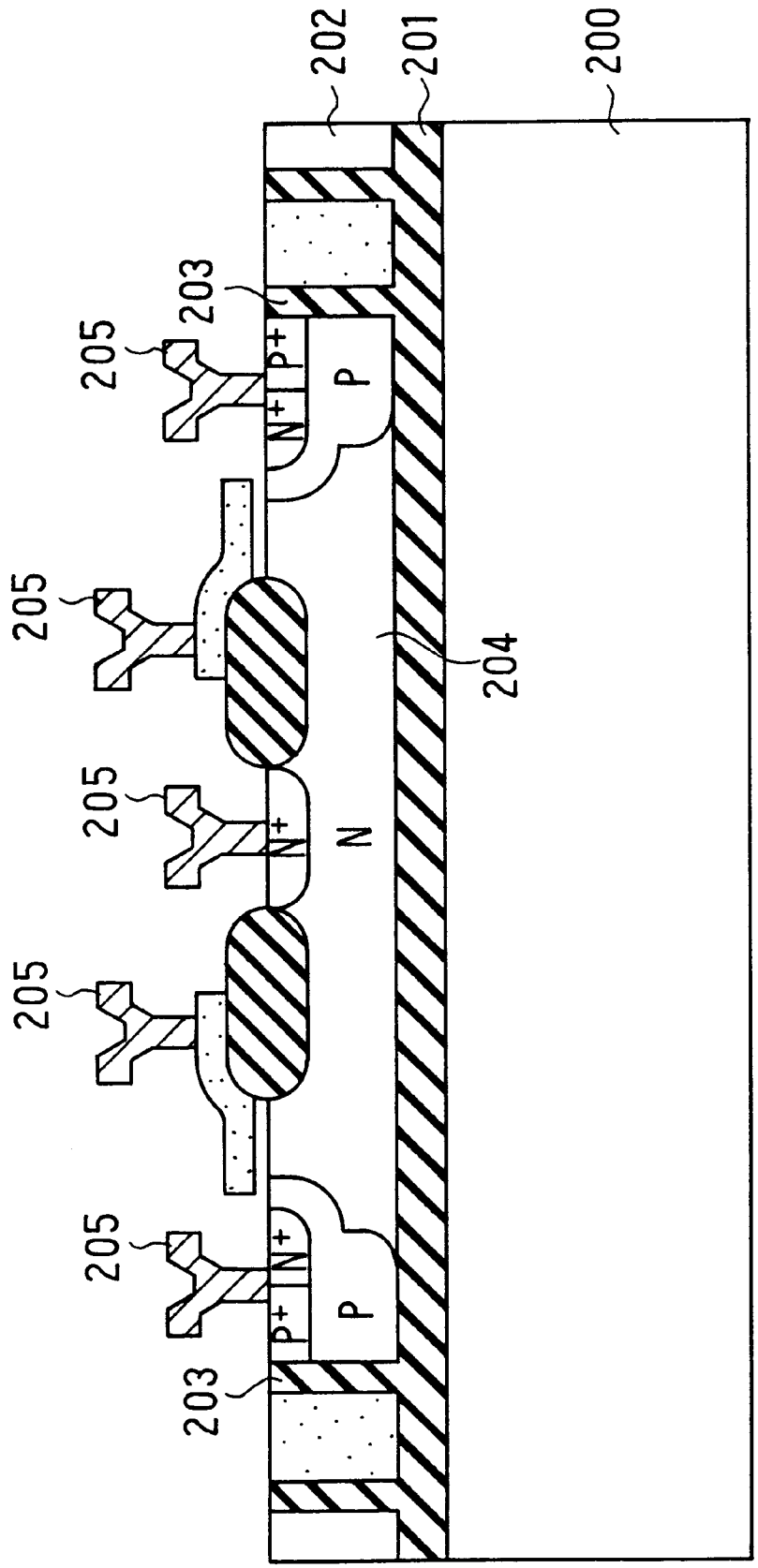
FIG. 32 is a cross-sectional view showing a semiconductor device in a prior art.

Incidentally, after the structure shown in FIG. 28C is formed, the silicon substrate 100 may be bonded to the structure. In this case, a semiconductor device shown in FIG. 31 is subsequently formed via the same manufacturing steps just described. The semiconductor device also provides the same effects as described above. The silicon substrate 100 may be bonded after an oxide film is formed on the surface of the silicon substrate 100.

In the embodiments described above, the semiconductor substrates, the semiconductor layers, the first and second impurity diffused semiconductor layers may be include SiC, GaAs, or the like instead of silicon (Si). A thyristor can be formed in the silicon island instead of the MOS transistor and the IGBT. At that time, a cathode of the thyristor can be connected to the electrode for applying the potential to the substrate.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor device comprising:
   a substrate;
   a first impurity diffused semiconductor layer disposed on the substrate;
   a buried oxide film disposed on the first impurity diffused semiconductor layer;
   a semiconductor island disposed on the buried oxide film and surrounded by a trench, the trench extending to the first impurity diffused semiconductor layer;
   a side wall oxide film disposed on a side wall of the trench to cover the semiconductor island exposed on the side wall;
   a semiconductor element provided in the semiconductor island;
   a second impurity diffused semiconductor layer filling the trench to communicate with the first impurity diffused semiconductor layer underlying the semiconductor island, and electrically insulated from the semiconductor island by the side wall oxide film and by the buried oxide film; and
   a potential applying electrode disposed on the second impurity diffused semiconductor layer, for applying an electric potential to the first and second impurity diffused semiconductor layers.

2. The semiconductor device of claim 1, wherein the semiconductor element has a semiconductor element electrode electrically connected to the potential applying electrode.

3. The semiconductor device of claim 2, wherein the semiconductor element is one selected from a group consisting of a MOS transistor, an IGBT, and a thyristor, and has an electrode connected to the potential applying electrode.

4. The semiconductor device of claim 1, wherein:

first and second semiconductor islands electrically isolated from one another by the trench is disposed on the buried oxide film; and the first impurity diffused semiconductor layer is divided into two parts by a region, the two parts respectively underlying the first and second semiconductor islands, the region being made of one selected from a non-doped semiconductor layer and a third impurity diffused semiconductor layer which is a reverse conductive type with respect to the first impurity diffused semiconductor layer.

5. The semiconductor device of claim 1, wherein:

first and second semiconductor islands electrically isolated from one another by the trench is disposed on the buried oxide film; and the first impurity diffused semiconductor layer is divided into two parts electrically isolated from one another by an insulating region, the two parts respectively underlying the first and second semiconductor islands for applying substrate potentials.

6. The semiconductor device of claim 1, wherein the semiconductor element has an activation region of the semiconductor element and an electric field alleviation trench between the activation region and the side wall oxide film.

7. The semiconductor device of claim 6, wherein the electric field alleviation trench is filled with an insulation material.

8. The semiconductor device of claim 6, wherein the electric field alleviation trench is filled with a conductive material for being set at a specific electric potential.

9. The semiconductor device of claim 1, wherein:

the semiconductor island includes an activation region of the semiconductor element;

a field oxide film is disposed on the first semiconductor island between the activation region and the side wall oxide film; and an electric potential alleviation electrode for being set at a specific electric potential is disposed on the field oxide film.

10. The semiconductor device of claim 1, wherein the semiconductor island is made of silicon and the first and second impurity diffused semiconductor layers are made of polysilicon doped with impurities.

11. A semiconductor device comprising:

a substrate;

a buried oxide film disposed on the substrate and having an opening portion;

first and second semiconductor islands isolated from one another by a trench and disposed on the substrate through the buried oxide film;

a side wall oxide film covering the first and second semiconductor islands exposed in the trench;

a semiconductor element provided in the first semiconductor island;

an impurity diffused semiconductor layer disposed between the buried oxide film and the substrate, electrically insulated from the first semiconductor island, and electrically communicating with the second semiconductor island by filling the opening portion of the buried oxide film; and a potential applying electrode provided on the second semiconductor island for applying an electric potential to the impurity diffused semiconductor layer through the second semiconductor island.

12. The semiconductor device of claim 11, further comprising a third semiconductor island insulated from the first and second semiconductor islands and another semiconductor element provided in the third semiconductor island, wherein the impurity diffused semiconductor layer is divided by an insulating layer into two parts respectively underlying the first and third semiconductor islands for respectively being set at specific substrate potentials.

13. The semiconductor device of claim 11, wherein:

the first semiconductor island includes an activation region of the semiconductor element and an electric field alleviation trench between the activation region and the side wall oxide film.

14. The semiconductor device of claim 13, wherein the electric field alleviation trench is filled with an insulation material.

15. The semiconductor device of claim 13, wherein the electric field alleviation trench is filled with a conductive material for being fixed at a specific electric potential.

16. The semiconductor device of claim 11, wherein:

the first semiconductor island includes an activation region of the semiconductor element;

a field oxide film is disposed on the first semiconductor island between the activation region and the side wall oxide film; and an electric field alleviation electrode for being set at a specific electric potential is disposed on the field oxide film.

17. The semiconductor device of claim 11, wherein the first and second semiconductor islands are made of silicon, and the impurity diffused semiconductor layer is made of a polysilicon layer doped with impurities.

18. A method of manufacturing a semiconductor device, comprising steps of:

forming a trench for element isolation on a main surface of a first semiconductor substrate;

forming an oxide film on the main surface including an inside wall of the trench of the first semiconductor substrate;

forming an impurity diffused semiconductor layer on the oxide film and in the trench to fill the trench;

flattening a surface of the impurity diffused semiconductor layer on a main surface side of the first semiconductor substrate;

bonding the surface of the impurity diffused semiconductor layer on the main surface side of the first semiconductor substrate to a polished surface of a second semiconductor substrate;

grinding and polishing a surface of the first semiconductor substrate on a side opposite to the main surface side so that a semiconductor island surrounded by the impurity diffused semiconductor layer filling the trench through the oxide film is formed;

forming a semiconductor element in the semiconductor island; and forming a potential applying electrode on the impurity diffused semiconductor layer.

19. The method of claim 18, further including a step of doping impurities into a part of the impurity diffused semiconductor layer so that the part becomes reverse conductive type with respect to the impurity diffused semiconductor layer, after the step of forming the impurity diffused semiconductor layer.

20. A method of manufacturing a semiconductor device, comprising steps of:

forming a buried oxide film on a main surface of a first semiconductor substrate with an opening portion exposing the first semiconductor substrate;

forming an impurity diffused semiconductor layer on the buried oxide film and in the opening portion;

forming an insulating oxide film on the impurity diffused semiconductor layer;

forming a bonding film on the insulating oxide film;

flattening a surface of the bonding film;

bonding the surface of the bonding film to a polished surface of a second semiconductor substrate;

forming a trench in the first semiconductor substrate from a back surface of the first semiconductor substrate so that the buried oxide film is exposed from the trench and so that first and second semiconductor islands isolated from one another by the trench are provided, the first semiconductor island being isolated from the impurity diffused semiconductor layer by the buried oxide film interposed therebetween, the second semiconductor island communicating with the impurity diffused semiconductor layer through the opening portion;

forming a side wall oxide film on an inside wall of the trench;

filling the trench with a thin film;

forming a semiconductor island in the first semiconductor island; and forming a potential applying electrode on the second semiconductor island electrically connected to the impurity diffused semiconductor layer, for applying an electric potential to the impurity diffused semiconductor layer.

21. The method of claim 20, further comprising a step of grinding and polishing the first semiconductor substrate on a back surface side opposite to the main surface so that the first and second semiconductor islands are exposed, after the step of filling the trench.

22. The method of claim 20, wherein the impurity diffused semiconductor layer is formed with an opening portion and the opening portion of the impurity diffused semiconductor layer is filled with the insulating oxide film so that the impurity diffused semiconductor layer is divided into two parts electrically insulated from one another and respectively fixed at specific electric potentials.

23. The method of claim 20, wherein the first semiconductor substrate is made of silicon and the impurity diffused semiconductor layer is a polysilicon layer doped with impurities.

24. A semiconductor device comprising:

a substrate;

a semiconductor island layer disposed on the substrate and having a semiconductor island covered with an insulating film except a main surface on a side opposite to the substrate and surrounded by a trench formed in the semiconductor island layer, the insulating film being composed of a buried insulating film disposed between the semiconductor island and the substrate and a side wall insulating film disposed on a side wall of the semiconductor island exposed in the trench;

a semiconductor element provided in the semiconductor island;

an impurity diffused semiconductor layer underlying the semiconductor island at a position between the buried insulating film and the substrate and electrically isolated from the semiconductor island by the insulating film;

an electric potential applying electrode disposed on the semiconductor island layer to be electrically isolated from the semiconductor island and to electrically communicating with the impurity diffused semiconductor layer for applying an electric potential to the impurity diffused semiconductor layer; and a conductive portion disposed in the semiconductor island layer and connecting the electric potential applying electrode and the impurity diffused semiconductor layer.

25. The semiconductor device of claim 24, wherein the conductive portion is buried in the trench, and the electric potential applying electrode is provided on the conductive portion.

26. The semiconductor device of claim 25, wherein the conductive portion is made of an impurity diffused semiconductor layer.

27. The semiconductor device of claim 24, wherein:

the conductive portion is a secondary semiconductor island provided in the semiconductor island layer and electrically isolated from the semiconductor island in which the semiconductor element is provided; and the electric potential applying electrode is disposed on the secondary semiconductor island.

* * * * *